(12) United States Patent
Scott et al.

(10) Patent No.: US 8,044,435 B2
(45) Date of Patent: Oct. 25, 2011

(54) SUB-PIXEL NBN DETECTOR

(75) Inventors: Jeffrey W. Scott, Carpinteria, CA (US);
Colin E. Jones, Santa Barbara, CA (US);
Ernie J. Caine, Santa Barbara, CA (US);
Charles A. Cockrum, Goleta, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 713 days.

(21) Appl. No.: 11/939,464

(22) Filed: Nov. 13, 2007

(65) Prior Publication Data
US 2008/0111152 A1 May 15, 2008

Related U.S. Application Data

(60) Provisional application No. 60/880,580, filed on Jan. 12, 2007, provisional application No. 60/865,793, filed on Nov. 14, 2006.

(51) Int. Cl.
*H01L 21/02* (2006.01)

(52) U.S. Cl. ......... 257/196; 257/184; 257/185; 257/459; 257/E31.02

(58) Field of Classification Search .................. 257/17, 257/21, 184, 189, 196, 443, 459, E31.02, 257/E31.021, E31.022, 185, 191
See application file for complete search history.

(56) References Cited

U.S. PATENT DOCUMENTS

| | | | |
|---|---|---|---|
| 5,802,738 A | | 9/1998 | Ferniani |
| 6,107,652 A | * | 8/2000 | Scavennec et al. ........... 257/184 |
| 6,403,990 B1 | * | 6/2002 | Kaneko et al. ................ 257/184 |
| 6,821,810 B1 | * | 11/2004 | Hsiao et al. .................... 438/69 |
| 2004/0119093 A1 | * | 6/2004 | Cohen et al. .................. 257/200 |
| 2004/0119129 A1 | * | 6/2004 | Giboney ........................ 257/458 |
| 2007/0215900 A1 | * | 9/2007 | Maimon ....................... 257/184 |

FOREIGN PATENT DOCUMENTS

| | | |
|---|---|---|
| JP | 63056965 | 3/1988 |
| JP | 20050268271 | 3/2007 |

* cited by examiner

*Primary Examiner* — Minh-Loan T Tran
*Assistant Examiner* — Leslie Pilar Cruz
(74) *Attorney, Agent, or Firm* — Birch, Stewart, Kolasch & Birch, LLP

(57) ABSTRACT

A method of making a two-dimensional detector array (and of such an array) comprising, for each of a plurality of rows and a plurality of columns of individual detectors, forming an n-doped semiconductor photo absorbing layer, forming a barrier layer comprising one or more of AlSb, AlAsSb, AlGaAsSb, AlPSb, AlGaPSb, and HgZnTe, and forming an n-doped semiconductor contact area.

36 Claims, 21 Drawing Sheets

Figure 1 Standard InGaAs detector array and band structure

PRIOR ART

Figure 2. nBn detector array and band structure

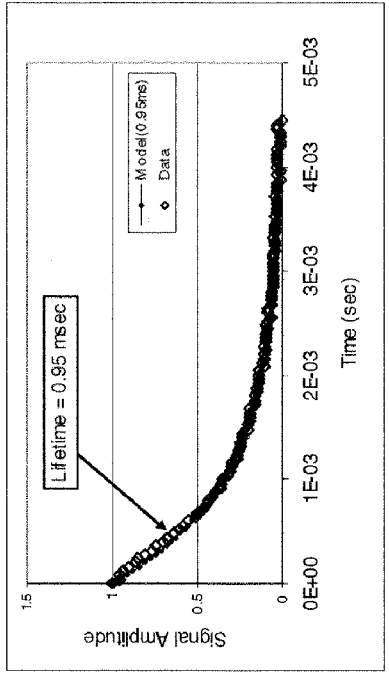
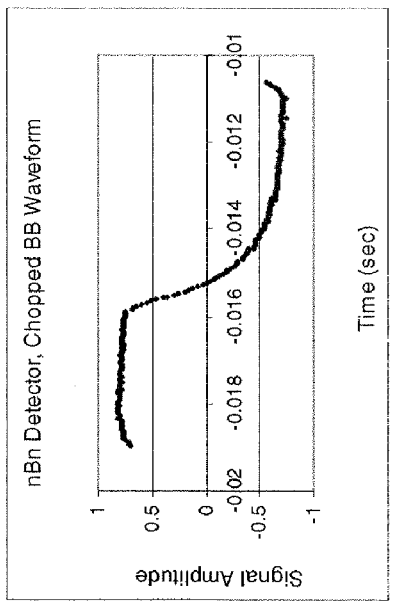
Figure 6
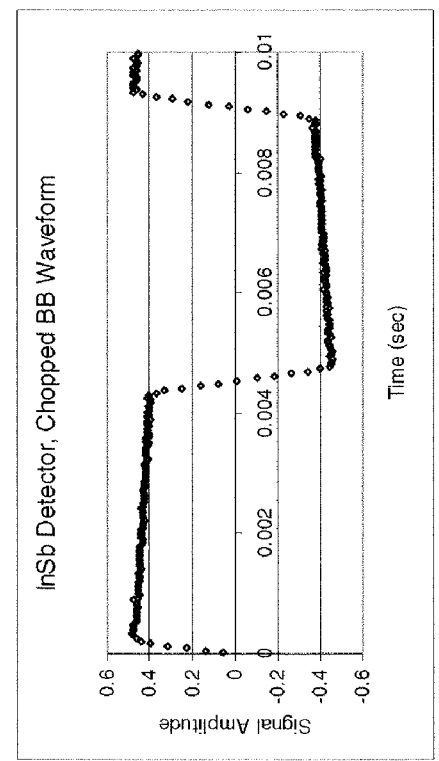
Figure 7

Alternate embodiment, eliminates additional In bump per unit cell. Each guard is biased to sweep out unwanted dark current. Guards are tied together with a resistive thin metal network (blue), limiting sensitivity to defects in the barrier to the pixel or it's nearest neighbors due to the spreading resistance (~3/4 voltage dropped in initial 4 bridges)

Alternate embodiment, eliminates additional in bump per unit cell. Each pixel is isolated from a common guard which is biased to sweep out unwanted dark current.

SUB-PIXEL NBN DETECTOR

CROSS-REFERENCE TO RELATED APPLICATIONS

This application claims priority to and the benefit of the filing of U.S. Provisional Patent Application Ser. No. 60/880,580, entitled "High-Integration Micro-Imager", filed on Jan. 12, 2007, and of U.S. Provisional Patent Application Ser. No. 60/865,793, entitled "SWIR High Integration Micro-Imager Camera", filed on Nov. 14, 2006, and the specifications and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to micro-imaging devices, particularly infrared imagers.

2. Description of Related Art

Revolutionary improvements in size and power consumption are required to realize extremely lightweight micro cameras. To that end, the present invention is of a highly integrated digital Focal Plane Array that combines a fully digital camera sensor engine-on-a-chip with a novel detector concept that enables high quantum efficiency, diffusion-limited detector performance in a small pixel by eliminating the perimeter and surface leakage currents. Together these innovations will allow the manufacture of low-cost completely uncooled shortwave infrared (SWIR) digital imagers compatible with, for example, unmanned aerial vehicle (UAV) micro-ball gimbaled packaging, with weights under 10 grams and the sensitivity to operate in nightglow environments. The detector concepts enable higher operating temperature midwave infrared (MWIR) and longwave infrared (LWIR) applications as well.

BRIEF SUMMARY OF THE INVENTION

The present invention is of a method of making a two-dimensional detector array (and of such an array) comprising, for each of a plurality of rows and a plurality of columns of individual detectors: forming an n-doped semiconductor photo absorbing layer; forming a barrier layer comprising one or more of AlSb, AlAsSb, AlGaAsSb, AlPSb, AlGaPSb, and HgZnTe; and forming an n-doped semiconductor contact area. In the preferred embodiment, forming the absorbing layer comprises grading the absorbing layer to create a quasi-electric field driving minority carriers into the barrier layer, preferably wherein the quasi-electric field has a force on the minority carriers that is stronger than the force of lateral diffusion. Alloys at interfaces between the barrier layer and the photo absorbing layer and the contact area are preferably graded, whereby spikes in minority carrier band edges are substantially reduced. A diffusion barrier layer between the photo absorbing layer and a substrate is preferably formed. The contact area can include a guard n-doped semiconductor, either including connecting the guard n-doped semiconductor for each detector via series resistors to a guard n-doped semiconductor of one or more adjacent detectors in the array or wherein the guard n-doped semiconductor is monolithic and isolated from the active n-doped semiconductor contact area of each detector. An AlGaSb buffer layer between the n-doped photo absorbing layer and a substrate is preferably formed, wherein Al content of the buffer layer is graded. By growing strained AlGaSb superlattice buffer layers whose average aluminum content increases, the effective substrate lattice constant can be shifted to larger values. Strained superlattice layers can be used to shift lattice constants because the threading dislocations become bound at the interfaces instead of creating defects in the active material.

The present invention is further of a method of making a two-dimensional detector array (and of such an array) comprising, for each of a plurality of rows and a plurality of columns of individual detectors: forming an n-doped semiconductor photo absorbing layer; forming an InGaAs barrier layer; and forming an n-doped semiconductor contact area.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 6 shows measured signal decay data showing minority carrier lifetime of 950 µsec, which validates that non-fundamental generation-recombination mechanisms are not operative in an InAs nBn detector;

FIG. 7 shows comparable measurements on a large area InSb photodiode, demonstrating lifetime degradation caused by excess g-r and surface mechanisms;

DETAILED DESCRIPTION OF THE INVENTION

Figure 1:
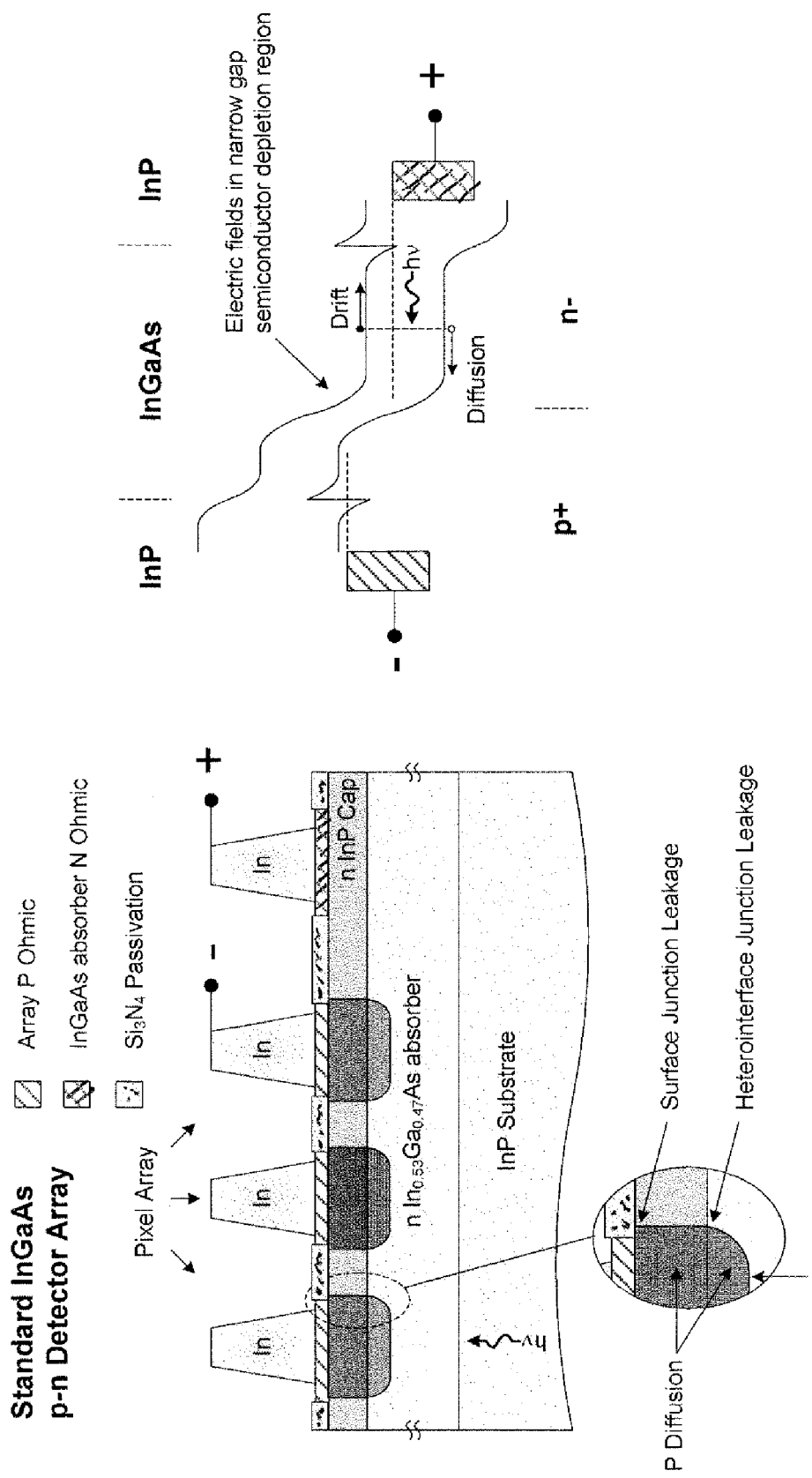
FIG. 1 shows a standard InGaAs detector array and corresponding band structure.

The present invention is of a highly integrated digital Focal Plane Array (FPA) that combines a fully digital camera sensor engine-on-a-chip with a novel detector concept that enables high quantum efficiency, diffusion-limited detector performance in a small pixel by eliminating the perimeter and surface leakage currents. Together these innovations will allow the manufacture of low-cost completely uncooled shortwave infrared (SWIR) digital imagers compatible with, for example, unmanned aerial vehicle (UAV) micro-ball gimbaled packaging, with weights under 10 grams and the sensitivity to operate in nightglow environments. The invention also concerns technology improvements that make the FPA of the invention possible, including the improvements to nBn technology disclosed in U.S. patent application Ser. No. 11/276,962, entitled "Reduced Dark Current Photodetector", to Shimon Maimon, filed Mar. 19, 2006, and published as U.S. Patent Application Publication 2007/0215900. These technology improvements to the nBn detector are applicable to all wavelengths including SWIR, midwave infrared (MWIR) and longwave infrared (LWIR) versions of the detector.

The UAV exemplary application of the present invention preferably provides for the recognition a 1 m² target at a range of 100 meters. Target recognition is assumed to occur under worst-case conditions of a moonless night sky with a 30% target contrast relative to the background radiance. Using published data on night sky radiance and integrating over a 0.8 μm to 1.7 μm SWIR wave band, target reflectance is calculated to be $9.8\times10^9$ ph/cm²-sec-sr. Target recognition implies sufficient signal to noise ratio and spatial resolution. A 1280×1024 imaging system with a 40 degree horizontal field of regard satisfies spatial resolution requirements, placing a minimum of 9 line pairs on a 1 m×1 m target at 100 meters. A signal to noise ratio of 3 was selected as a minimum for the purpose of this analysis.

A radiometric model was generated which uses measured and modeled detector data and ROIC performance predictions based on previous designs. At an operating temperature of 27 C (300 K), target recognition goals are met under worst case night glow radiance. The camera system of the invention preferably comprises a manufacturable f/# 1.4 optical system coupled to a low noise focal plane array (FPA). Significantly higher system operating temperatures are possible during daytime operation where radiance and signal are substantial. A summary of optical system, detector, and ROIC parameters required to meet performance goals are tabulated in Table 1. Note that a detector fill factor is used, assuming a light concentrator such as a microlens reduces the active pixel area and hence the dark current.

TABLE 1

Preferred System Parameters

| Parameter | Requirement | Units |
|---|---|---|
| Optical System f/# | 1.4 | |
| Optical Path Transmission | 0.6 | |
| Detector Pitch | 15 | um |
| Detector Leakage Current Density | 3.00E+09 | A/cm^2 |
| Detector Dynamic Resistance | 9.50E+13 | Ohms |
| Detector Spectal Sensitivity | 0.8-1.7 | um |
| Detector Quantum Efficiency | 0.9 | e-/ph |
| Detector Physical Fill Factor | 0.2 | |
| Integration Time | 16.6 | mSec |
| ROIC Total Noise | 20 | e- |

Figure 3:
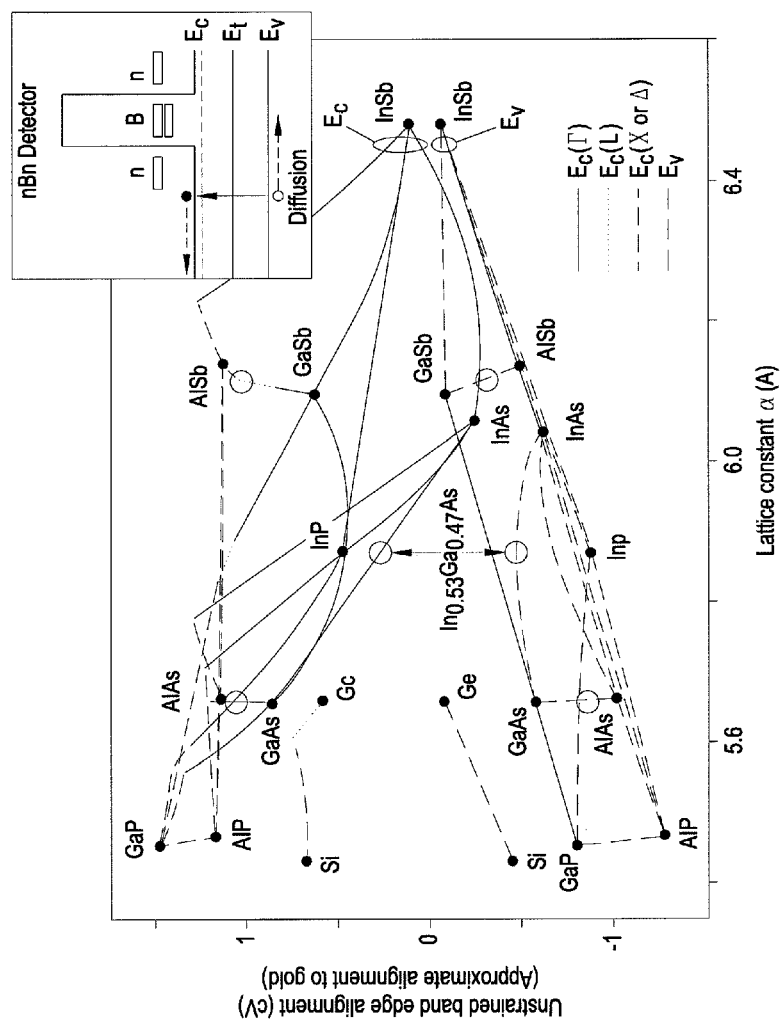
FIG. 3 shows band edge vs. lattice constant of common semiconductors, showing the AlGaAsSb barrier alloys selected to match the lattice constant and valence band offset of InGaAs on InP while presenting a high barrier in the conduction band.

InGaAs detectors lattice matched to InP provide uncooled operation with cutoff wavelengths of 1.7 μm. A review of the literature shows that the leakage current density of large area InGaAs detectors operating at room temperature is on the order of a few nA/cm². However, since small pixel sizes are required for imaging arrays, edge and surface effects become dominant. As the perimeter-to-area ratio increases, the dark current density can increase by a factor of 10 or more. For example, recent state-of-the-art room temperature data on a 25 μm pixel shows a dark current of 130 fA at 0.3V reverse bias or equivalently 19 nA/cm². The sources of these leakage currents are shown in FIG. 3, where heterojunction interfaces are shown as abrupt vs. graded for clarity. Most InGaAs detectors use an InP cap layer to reduce the surface leakage, however the high fields across the p-n junction remain sensitive to surface interface traps. Similar effects can occur at the heterointerface across the lateral p-n junction, as well as the midgap generation currents in the depletion region within the narrow gap InGaAs.

Figure 2:
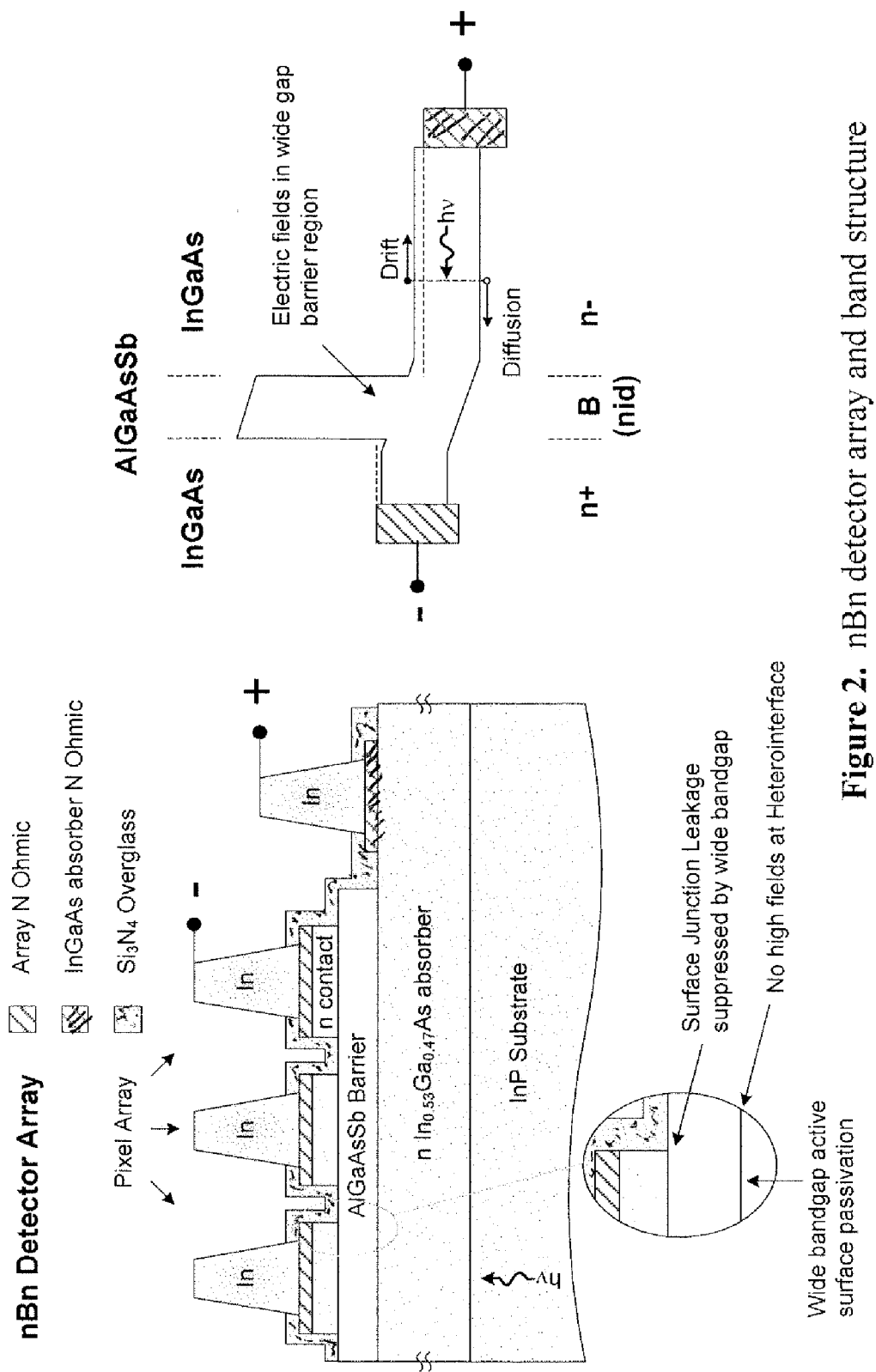
FIG. 2 shows an nBn detector array of the invention and corresponding band structure.

The nBn detector structure of the invention is shown in FIG. 2, where the standard InGaAs absorber now has a thin barrier layer and contact layer that replaces the p-n junction. Photo-generated minority carriers (holes) are collected while the barrier blocks majority carrier (electron) flow. The most notable difference is the lack of a p-n junction and the associated high fields within the narrow gap materials. The high fields across the p-n junction are the source of leakage currents in standard detectors. Instead, a barrier layer has been grown on the surface of the InGaAs with the unique property of presenting a high barrier to carrier flow in the conduction band, but with negligible barrier in the valence band. This enables a bias to be placed across the device without majority carrier current flow, while allowing the collection of photo-generated minority carriers by diffusion. The undoped wide-bandgap barrier acts simultaneously as surface passivation, contact isolation and minority carrier collector. Thus, there are no high lateral fields in the device, eliminating the perimeter leakage effects. Modeling as discussed later indicates the large area performance of 3 nA/cm² is achievable with a small pixel nBn detector.

Device fabrication is simple as well, making large arrays of very small pixels possible. The barrier layer itself is relatively thin, typically two thousand angstroms or less, and thus it can support latitude for strain in the barrier growth without detriment to device performance. The bandgap engineering of the nBn device requires knowledge of the conduction band and valence band offsets. The band offsets for the relevant materials vs. lattice constant is shown in FIG. 3. The dual vertical points identify the conduction band energy for a material at the upper point and the valance band energy at the lower point. The bandgap, conduction and valence band edges are shown for $In_{0.53}Ga_{0.47}As$ lattice matched with InP in red. Circled are the band edges for AlGaAs and for AlGaSb. It is apparent that a lattice match to InP can be achieved with an AlGaAsSb quaternary while producing a zero valance band offset as shown in the inset band diagram.

In order to reduce the detector dark current further to meet the stringent nightglow requirements, a sub-pixel active region can be used to reduce the dark current. This can be realized with the simple self-aligned junction processing for an nBn detector since there are not depletion zones nor diffusion or implantation processing. In the SWIR example, a standard InGaAs absorber is grown on InP, then the thin Barrier and top n contact layers complete the detector. As shown in FIG. 2, ohmic metal is deposited on the n contact layer, then selective etches are used to isolate the n contact using the contact metal as a self aligned mask. Pixel sizes below 4 µm are practically realized. If a 4 µm active is formed producing a 6 µm diameter effective active area in a 15 µm pixel, the dark current is reduced by 7×.

Microlens arrays or other light concentrators are required to take advantage of the sub-pixel active region. It is preferred to use a close proximity filter that enables placement of filters or microlens arrays to better than 2 microns true position in x, y and z across the focal plane. This microlens technique, commonly used in visible cameras, provides an additional reduction of the dark current so that the nightglow sensitivity requirement can be achieved with acceptable signal to noise ratio.

The above system analysis shows that the detector leakage current density must preferably be less than 3 $nA/cm^2$, including 1/f noise, and quantum efficiency must be greater than 90% if a 15 µm pixel-array is to resolve a 1 $m^2$ target under the most stressing conditions of a moonless, rural night sky at an ambient temperature of 300 K. Margin to these requirements is provided by incorporating a microlens array to the back surface of the FPA such that the incident IR signal onto a 15 µm pixel is concentrated into a 5 µm active area. The following discussion demonstrates that these conditions are met with nBn-based focal planes.

Routinely achieving this leakage current density is the most challenging problem for the detector manufacturer because all but the most fundamental leakage mechanisms must be eliminated, or at least reduced to the point that they do not add significantly to the detector's leakage current. As shown above in FIG. 1, this is very difficult for conventional photovoltaic devices for two reasons. First, the high electric fields in the depletion region of the p-n junction causes any carrier generated in that region to be swept to and collected by the contacts, leading to what is commonly referred to as G-R current. Crystalline imperfections and impurities associated within this region, whether they are the result of the junction formation process or residual defects within the material, can cause the generation of excess carriers whose flow can easily become the dominant leakage current mechanism. This is especially true in the region where the depletion region intersects the diode's surface because the termination of the detector's crystalline structure makes it even more difficult to avoid defects which give rise to this current. The surface of the neutral absorbing material is the second source of excess leakage current, again because of the difficulty in terminating the material's crystalline structure without creating defects and contamination, both of which are sources of excess carrier generation which increase leakage current. U.S. patent application Ser. No. 11/276,962 discloses a new type of semiconductor device, nBn detector, described above in FIG. 2, whose basic design eliminates both of these non-fundamental current mechanisms, leaving only diffusion current from the active absorbing material as the limiting mechanism.

Figure 4:
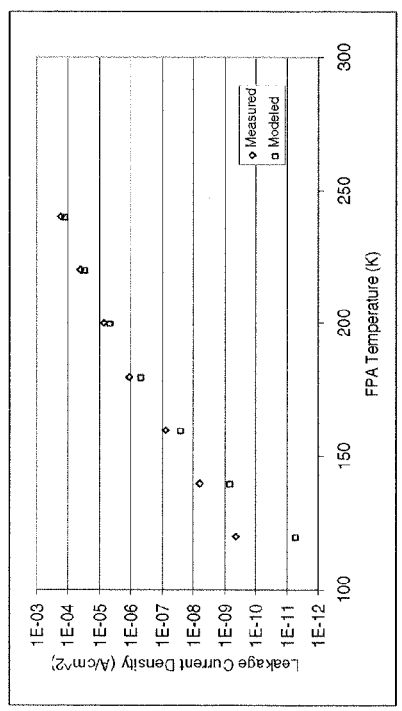
FIG. 4 is a graph comparing measured and modeled leakage current density, showing that NBn InAs detectors are diffusion limited above 160 K.

Tests on InAs nBn devices, with a cutoff wavelength of 3.6 µm, have validated this device concept. These measured data are compared to modeled diffusion-limited performance in FIG. 4, showing they are limited only by diffusion current for temperatures above 160 K.

Figure 5:
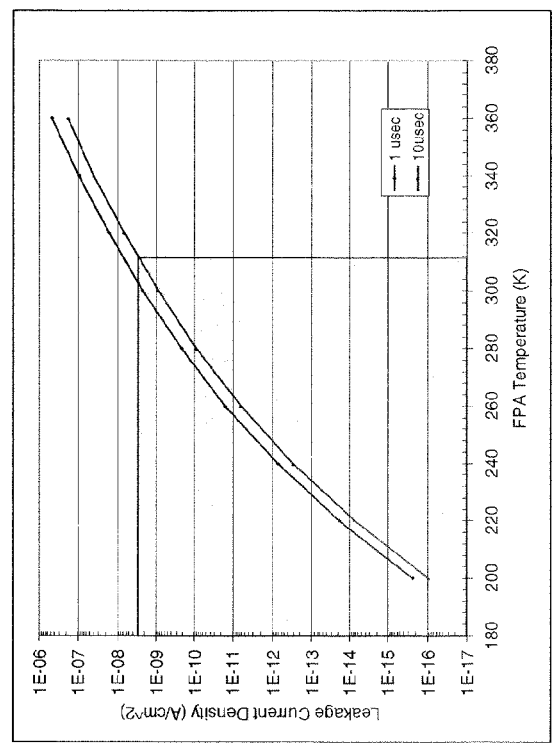
FIG. 5 is a graph showing modeled leakage current density for an InGaAs nBn detector and showing that 3 nA/cm$^2$ requirement can be met if lifetime in active layer exceeds about 1 µsec.

The same model is easily extrapolated to $In_xGa_{1-x}As$, where x=0.53 to meet the 1.7 µm cutoff wavelength required by the micro-platform missions. The results shown in FIG. 5, as plots of leakage current density versus detector temperature, demonstrate that leakage current density of less than 3 $nA/cm^2$ can be obtained at and below 300 K. The only parameters needed to determine this diffusion current are the thickness and doping concentration of the absorbing detector material and the lifetime of the minority carrier hole. All other parameters, such as intrinsic carrier concentration and minority carrier mobility, are fixed material properties. The modeled curves in FIG. 5 assume an absorbing layer thickness of 2 µm, doping concentration of $2 \times 1016$ $cm^{-3}$ and hole mobility of 500 $cm^2$/V-sec. The model also assumed a minority carrier lifetime of either 1 or 10 µsec, either of which are reasonable for high quality InGaAs material. The longer 10 µsec material provides about 10 K higher operating temperature, but is not required to meet the requirements.

A second validation of the nBn concept comes from an analysis of the chopped blackbody signal measured on InAs detectors. The decay of the signal amplitude, shown in FIG. 6, is fit to a single exponential decay with a time constant of 950 µsec. This very long lifetime can only be achieved if recombination mechanisms associated with material defects and surfaces are not present. By way of contrast, a similar analysis of a large-area InSb photodiode measured under the same conditions in FIG. 7 show that the signal's decay is much faster than the nBn detector, and is limited by the rate at which the chopper closes the blackbody aperture. Other measurements on InSb diodes show its effective lifetime to be less than 10 nsec, or about 2 orders of magnitude less than the nominal 1 µsec lifetime of the bulk InSb material.

The final conclusion is that a leakage current density of 3 $nA/cm^2$ can be achieved in very small InGaAs nBn devices because the active portion of the device is "buried" within wide bandgap materials and without reverse bias junction fields so that only by the most fundamental diffusion current mechanism is present.

Low frequency noise becomes a major concern, especially when requiring extremely low detector noise in a staring-format FPA. The observation made when testing the InAs nBn devices was that no 1/f noise was seen down to 1 Hz, even when the devices were biased to 2.0 V. This observation validates the claims that the nBn design eliminates excess leakage currents because 1/f noise is almost always associated with excess, i.e., non-diffusion, leakage current, especially when that current originates from tunneling or shunt resistance mechanisms.

Chopped blackbody measurements showed the quantum efficiency of the uncoated InAs devices to be 60%, a value that is limited only by reflection at the vacuum/InAs interface. Adding a simple 3 or 5 layer antireflection coating to the back surface of the detector substrate will easily reduce this loss to below 10%, thereby enabling the 90% quantum efficiency needed to meet the system flow down.

Figure 8:
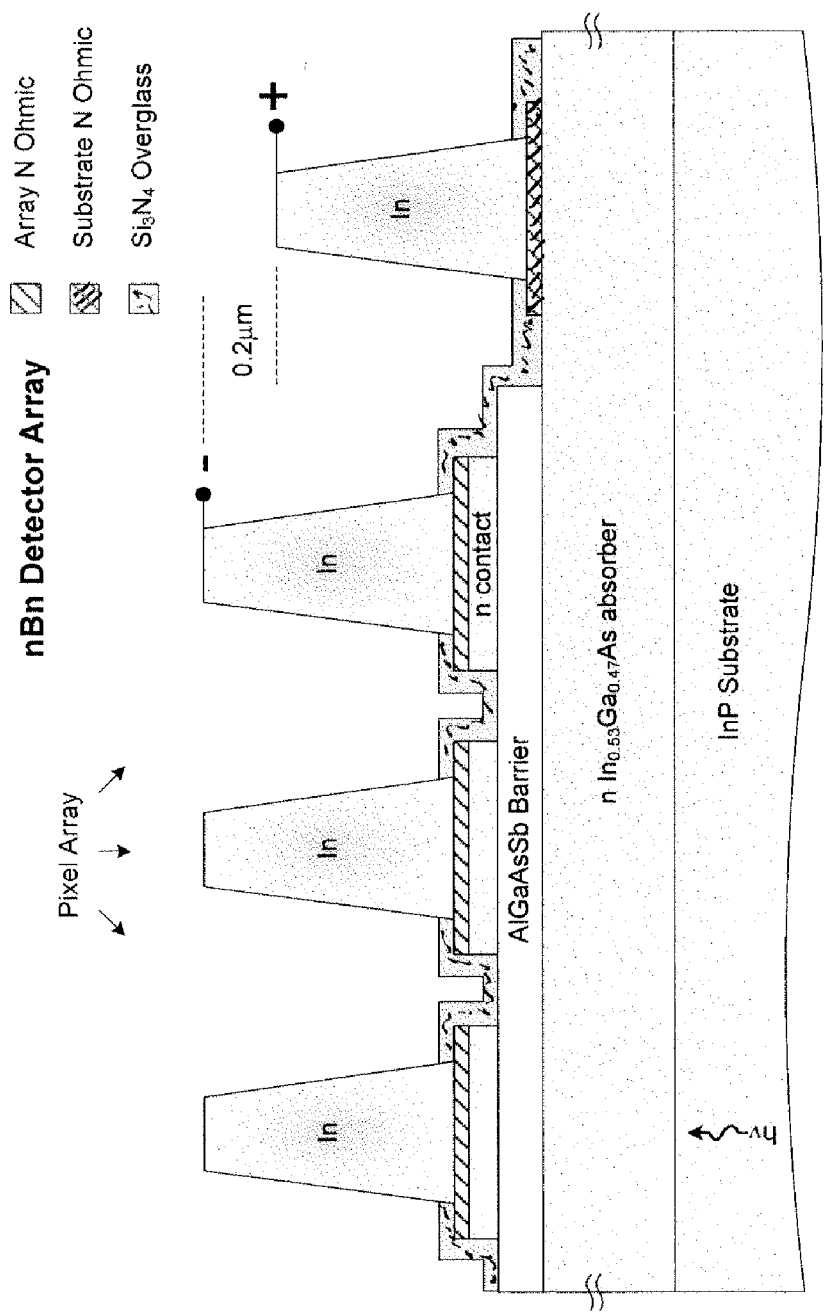
FIG. 8 is a cross section of an nBn detector according to the invention; note that near-planar architecture and self aligned pixel formation greatly simplifies the fabrication process and alignment tolerances.

The simplicity of the nBn structure makes it ideally suited for optical concentration. As shown in FIG. 8, the n absorber layer is continuous over the entire device as is the nominally 2000 Å thick Barrier layer except at its edges where ground contact is made to the absorber layer. Also, the n contact and metal layers are each less than 1000 Å thick, so the device's surface is essentially planar. The process to fabricate this device is also quite simple, comprising the following steps:

1. Mask and deposit contact metal to top n layer
2. Lift-off metal and etch to remove n layer between contacts and form individual pixels
3. Mask and etch to remove n and Barrier layers to expose absorber layer
4. Deposit ground metal and lift-off
5. Deposit $Si_3N_4$ overglass over entire wafer
6. Mask and etch openings to contacts and grounds
7. Mask for In bumps
8. Deposit In and lift-off
9. Mask and etch saw lanes
10. Dice, clean and demount The only critical mask step is the formation of the Array N ohmic—all other steps are self aligned or non critical. Since the structure is essentially planar, dimensions on the order of 1 μm are straightforward. Also, since the device is protected by a $Si_3N_4$ overglass, the indium bump can extend over the edge of the 5 μm diameter pixel, eliminating alignment and lithography concerns.

Figure 9:
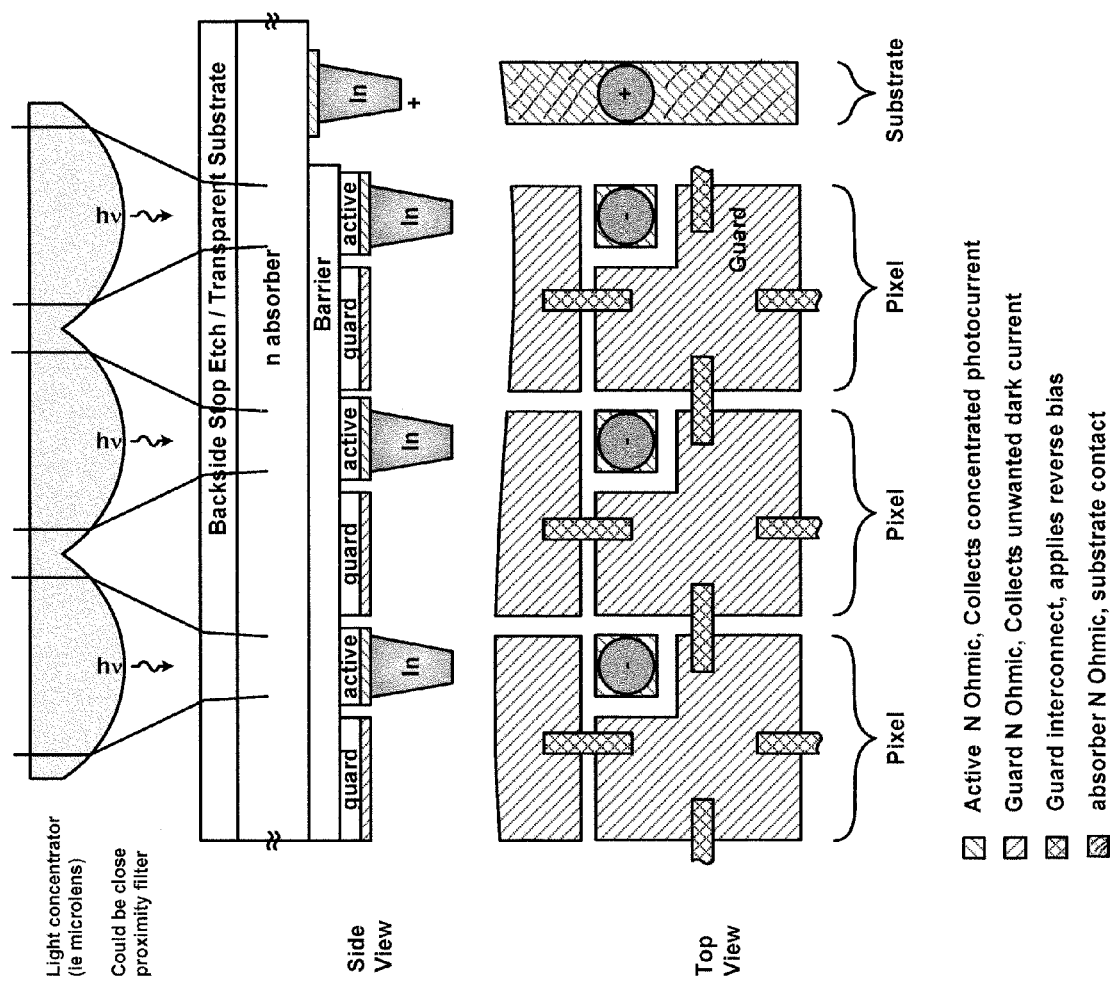
FIG. 9 shows a microlens concentrator and nBn guard according to the invention; each guard is biased to sweep out unwanted dark current, while maintaining the surface passivation quality of the barrier; each pixel's guard is electronically isolated by a resistive interconnect to minimize sensitivity to defects.

The microlens shown schematically in FIG. 9 will concentrate the light into the 5 μm diameter active area, thereby reducing the volume of material which generates diffusion current by a factor of $15^2/(\pi 2.5^2)=11.5$, but this leaves the problem of what to do with the diffusion current from the remainder of the 15 μm unit cell. An innovative solution to this problem is shown in FIG. 8 where large guard contacts that fill the areas not taken by the active areas are connected to their neighbors with four thin metal straps. The guards are then tied to a reverse bias supply around the perimeter of the array. The metal strips solve the problem that occurs when a short between one of the guards and the absorber layer occurs somewhere on the array, because they provide a spreading resistance which confines the resulting voltage drop to the immediate vicinity of the short. While this can create a small defect cluster, it eliminates the yield loss otherwise caused by a shorted guard.

Calculations of the optical performance including the microlens of the invention are show that both on axis and off axis cases support the spectral and optical transmission requirements and achieve the desired light concentration within a 5 μm diameter. The optimal sub-pixel active region location shifts as the position moves from center to edge, this can be accommodated for in the detector layout.

The present invention also comprises certain improvements to the base nBn infra-red detector. The improvements result in improved modulation transfer function, reduced dark current and designs that are more robust to manufacturing tolerances associated with the epitaxial growth of the semiconductor crystal. Alloy grading of the absorber is preferred, which provides an electrochemical field that will drive minority carriers to be collected in the contact instead of laterally diffusing to an adjacent pixel. Detector structures with sub-pitch pixels with biased guard rings reduce the dark current which is important for elevated operating temperature. The use of a hole diffusion barrier at the substrate eliminates excess dark currents while graded interfaces on the Barrier avoids heterointerface notches that can increase bias voltages due to thermionic emission limits. Specific embodiments are disclosed that enable the extension of the MWIR applications to SWIR and out to the long wavelength side (5 μm) of MWIR applications. These improvements can be extended to LWIR applications by using type II superlattices.

The improvements relate to six primary areas: (1) The photo generated minority carriers generated in the absorber diffuse to the barrier; lateral diffusion to adjacent pixels degrades the Modulation Transfer Function, as is observed in InSb MWIR focal plane arrays; (2) Non-ideal growth of the barrier alloys can lead to spikes in the minority carrier band edge, requiring excess voltage to turn on minority current collection; (3) The base nBn detector shows no minority carrier barrier between the absorber and the substrate, leading to excess dark currents from thermally generated carriers in the substrate; (4) The nBn structure does not allow mesa isolation of small pixels; making a small "detector within a pixel" allows a ~10× reduction in dark current, enabling even higher operating temperatures; (5) Cutoff wavelengths of nBn detectors grown on GaSb is ~4.5 μm; extending the cutoff to ~5 μm enables application to two-color threat warning applications; and (6) InGaAs is a mature 1.7 μm cutoff IR detector for SWIR applications; materials are disclosed that enable nBn structures on InGaAs.

Figure 10:
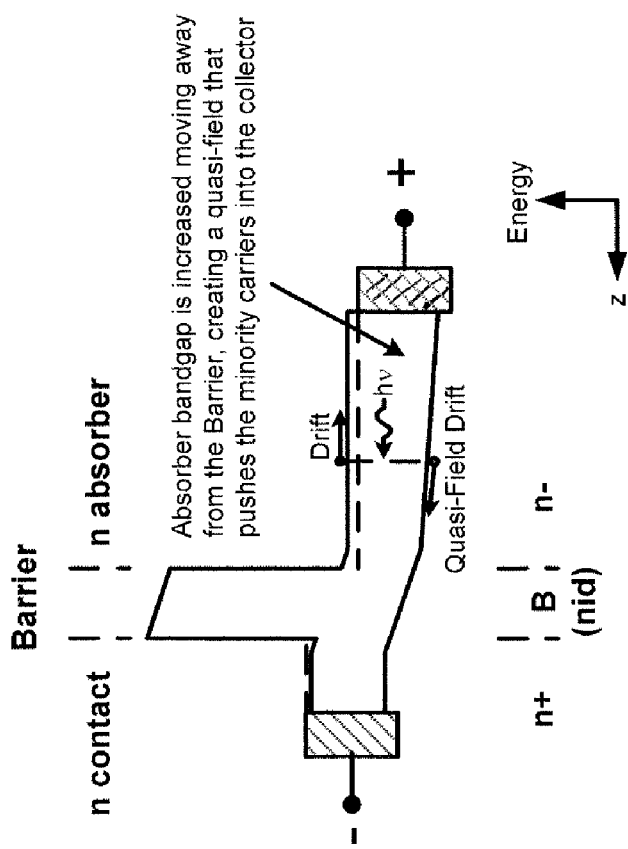
FIGS. 10 and 11 illustrate the benefits of grading the composition of the absorber allow in an nBn junction.
Figure 11:
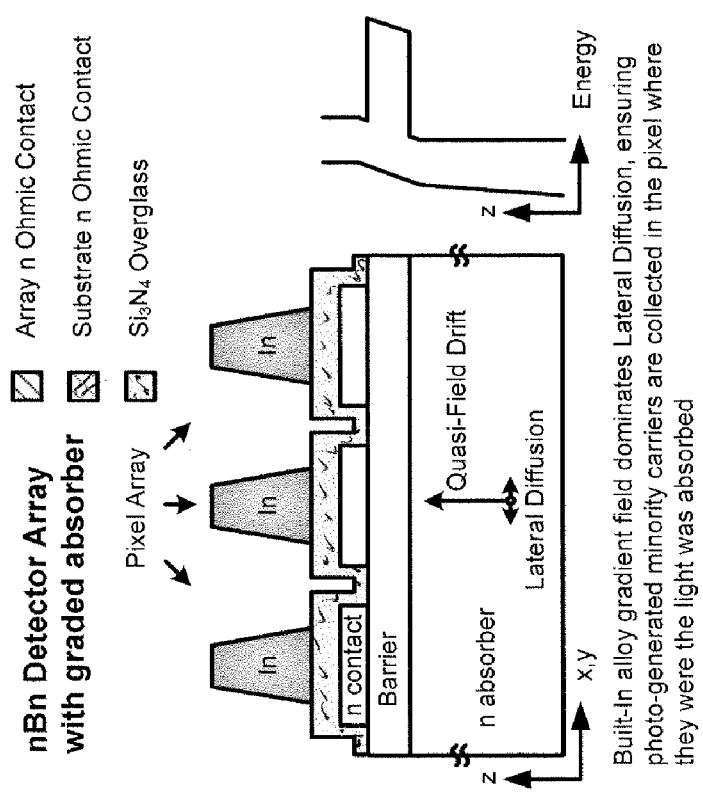

As to area (1), by grading the composition of the absorber alloy, the chemical potential creates a quasi-electric field that drives the minority carriers into the barrier. This quasi-field is much stronger than diffusion, so the lateral diffusion is dramatically reduced. This graded bandgap effect has been used on heterojunction bipolar transistors and HgCdTe IR p-n junction detector but has not been proposed or claimed for use in an nBn junction IR detector. See FIGS. 10 and 11.

Figure 12:
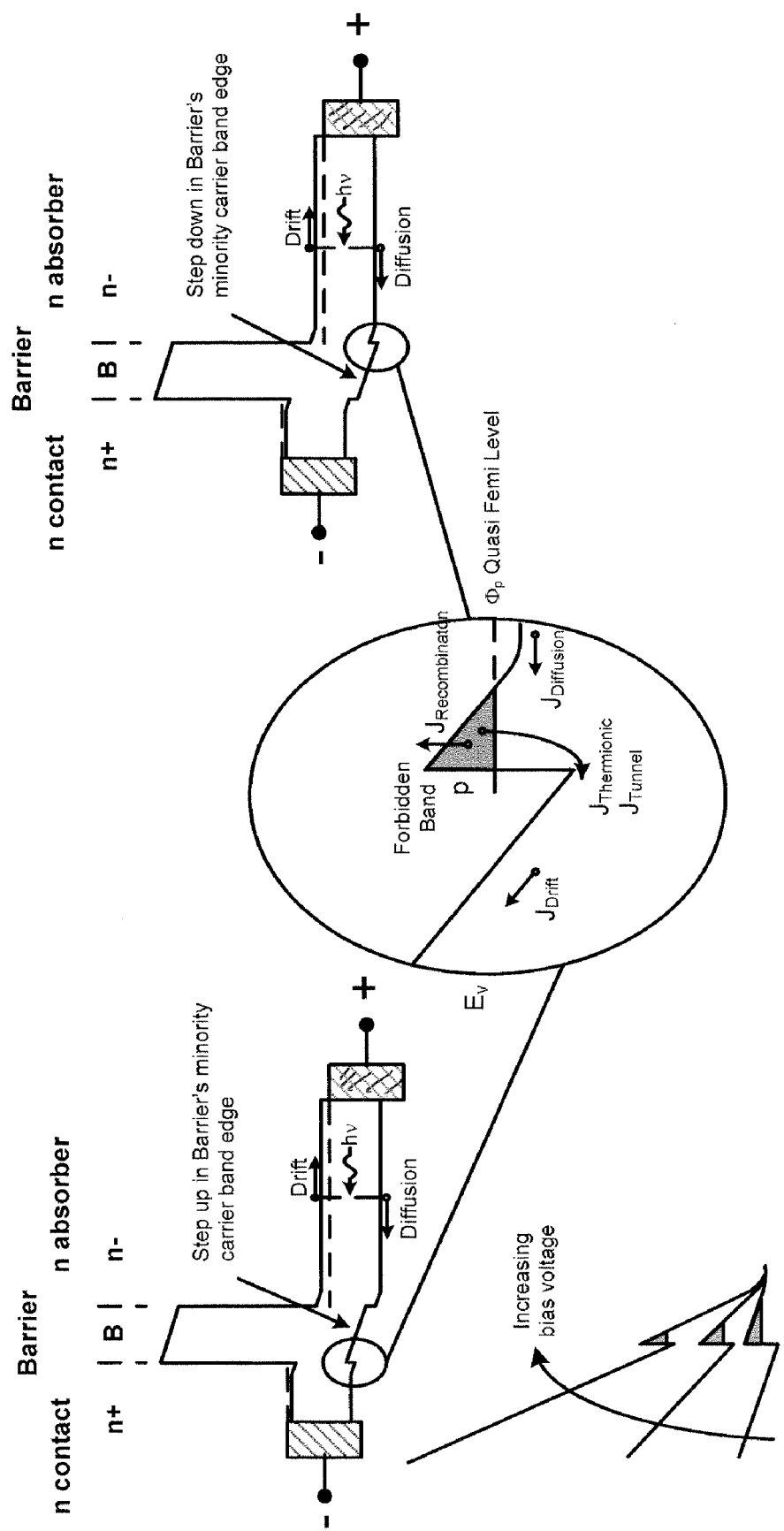
FIG. 12 illustrates band edge problems that can beset an nBn junction.
Figure 13:
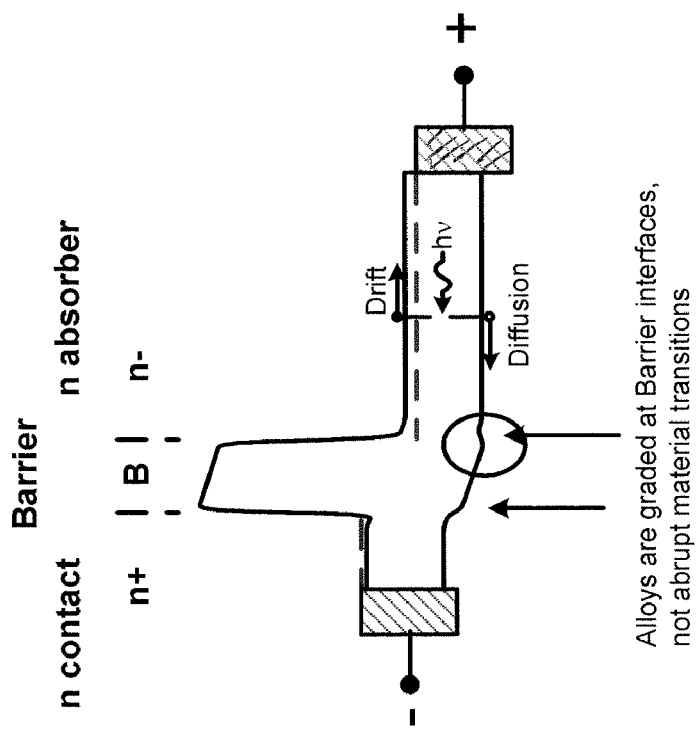
FIGS. 13 and 14 illustrate the benefits of grading the composition of the barrier component of the nBn junction.
Figure 14:
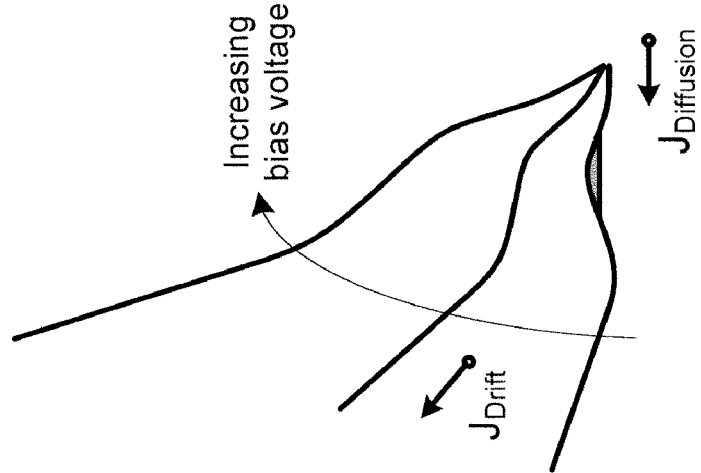

As to area (2), consider the conditions shown in FIG. 12. The spike cannot be eliminated with increasing bias voltage. The relative band offsets of the barrier and absorber change with temperature as well, complicating the optimal design. The abrupt interface case can lead to a notch in the band edge which traps the minority carriers. A local quasi-Fermi level rises as the carrier density, p, increases until the thermionic, tunneling and recombination currents equal the incoming diffusion current. Carriers that recombine do not generate signal current at the contacts, degrading detector performance and requiring increased bias voltage to collect the current. Referring to FIGS. 13 and 14, by grading the composition of the barrier to absorber and contact interfaces, the spikes at the heterointerfaces are eliminated. A much lower electric field can be applied to bias the collection of carriers in this non-ideal (and likely) case, making the design more robust to variations of alloys in the growth process.

Figure 15:
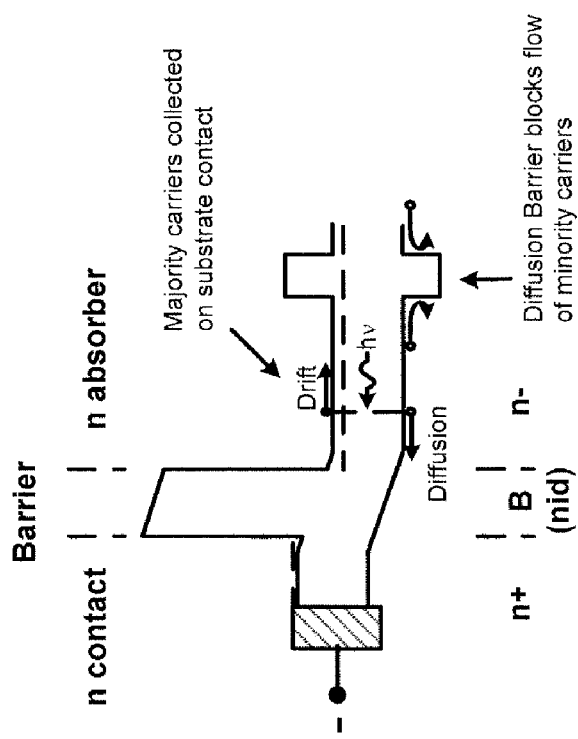
FIGS. 15 and 16 illustrate benefits of inclusion of a diffusion barrier and/or an etch stop in an nBn junction.
Figure 16:
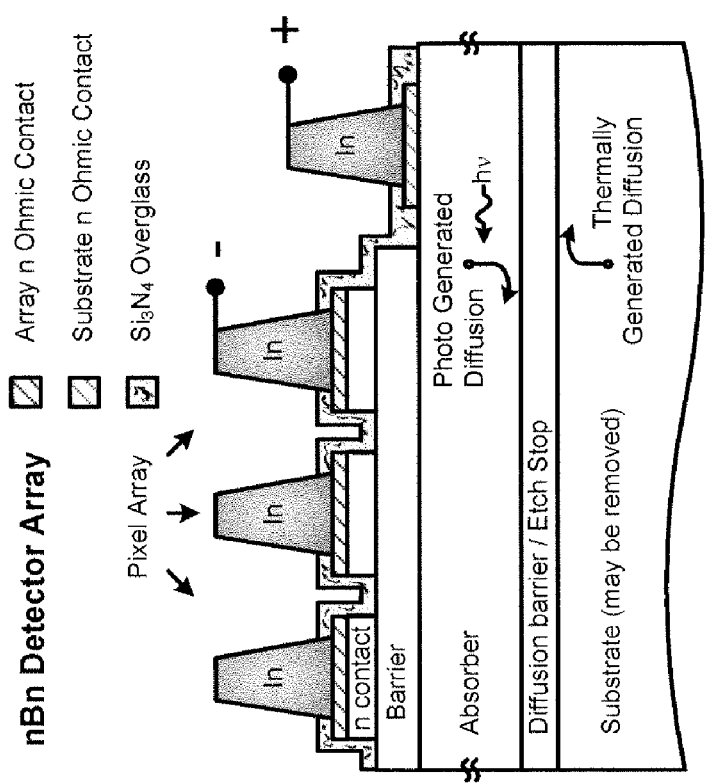
Figure 17:
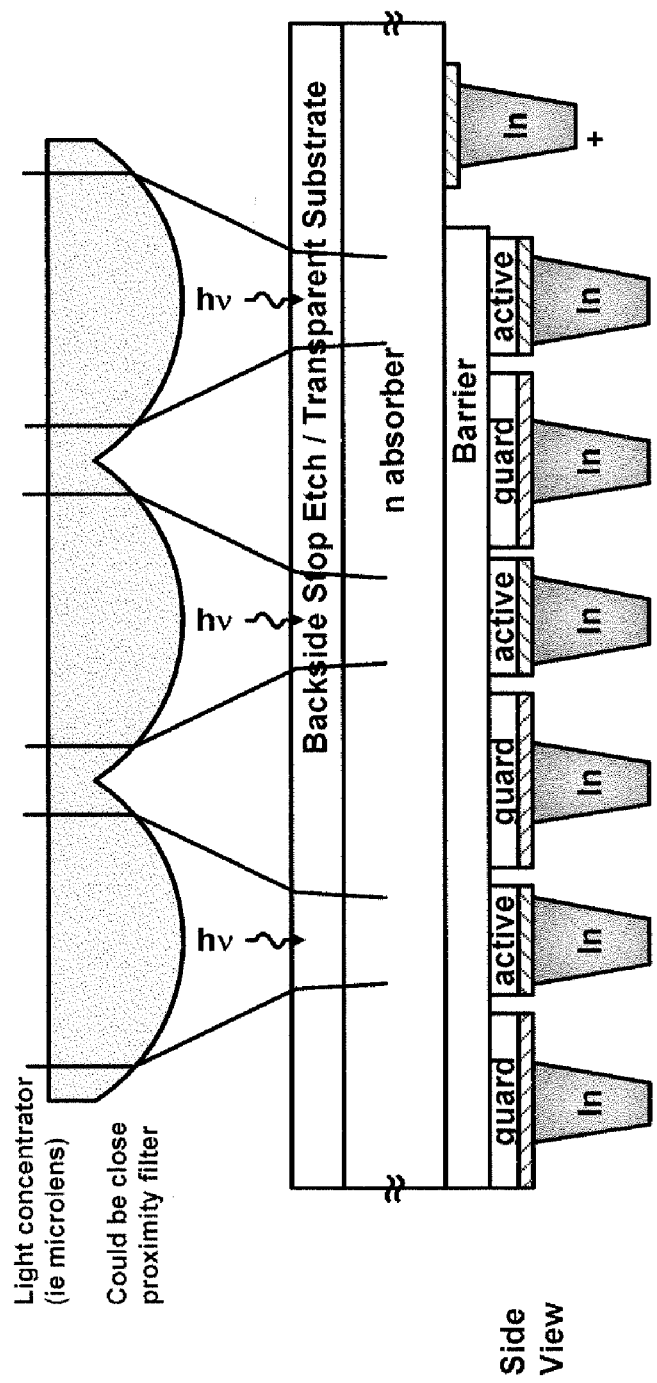
FIGS. 17-21 show embodiments of uses of biased guard rings to collect unwanted current in nBn structures.
Figure 18:
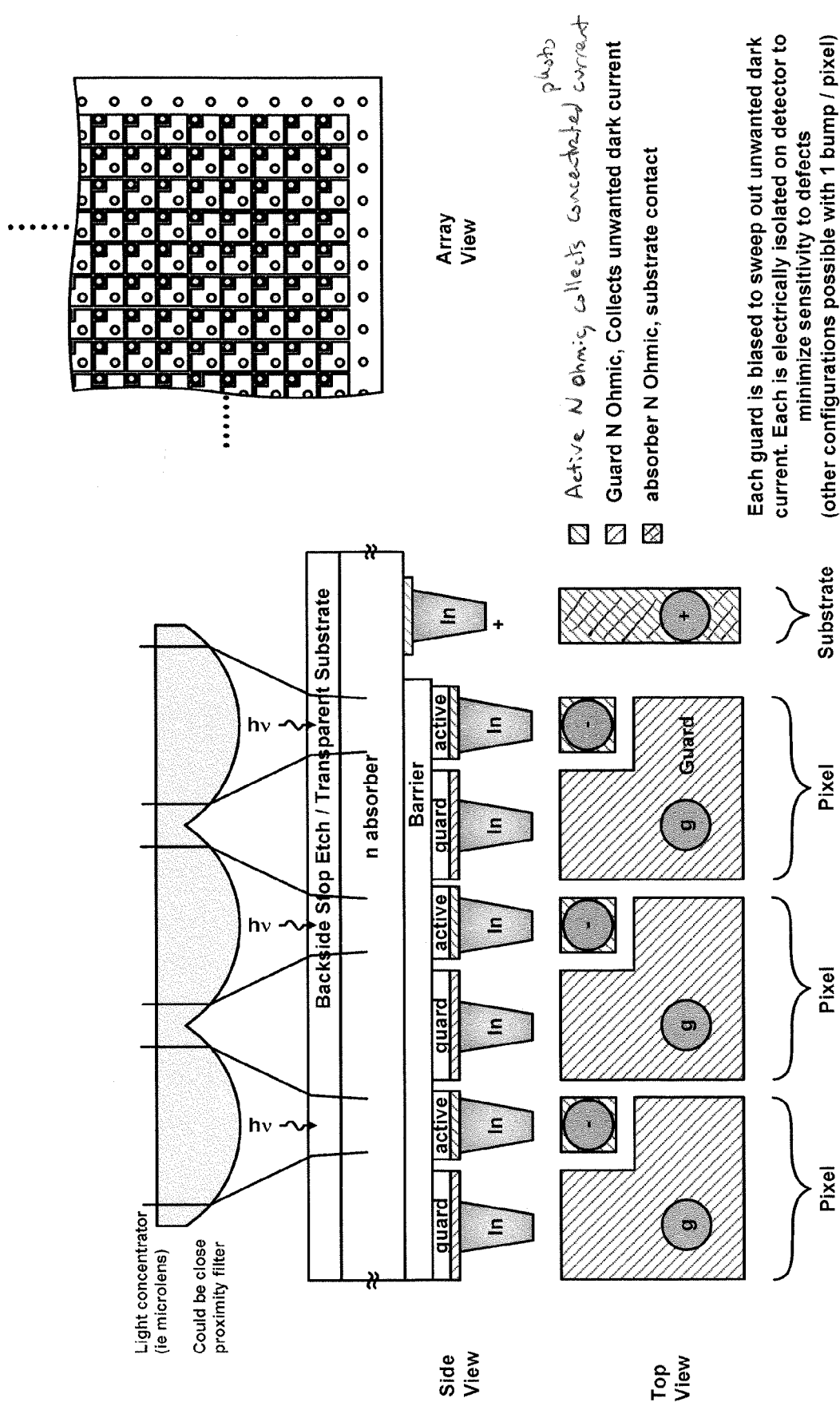
Figure 19:
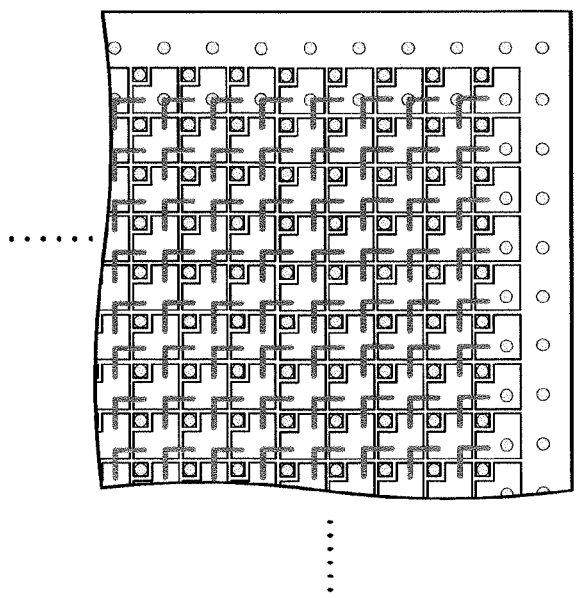
Figure 20:
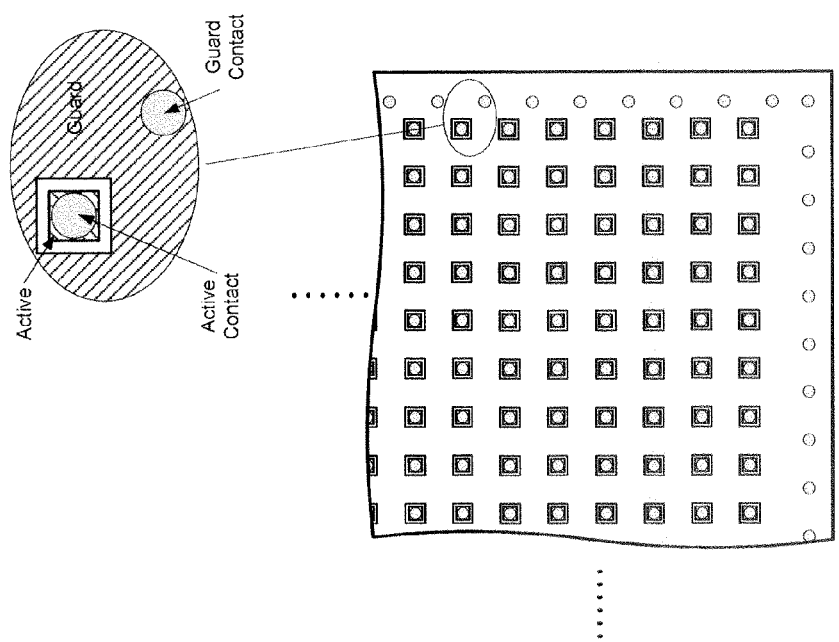
Figure 21:
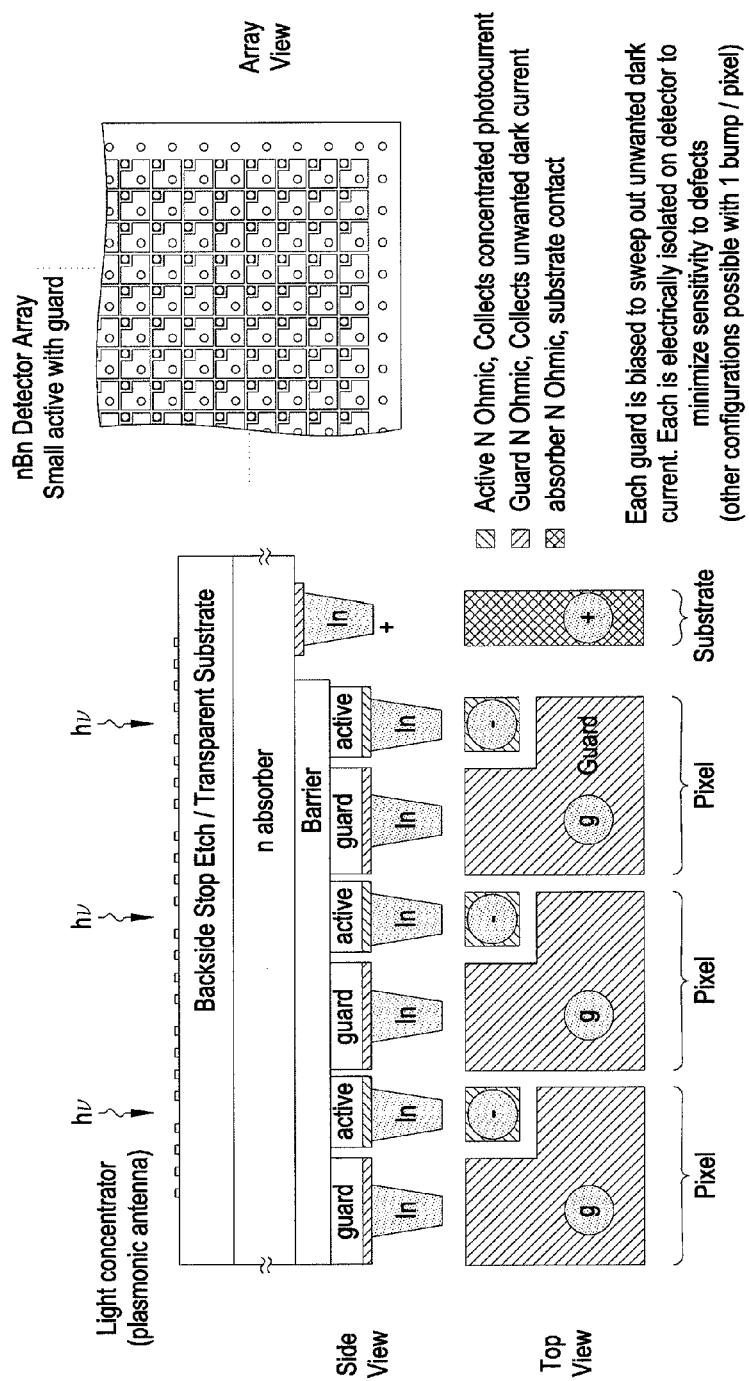

As to area (3), and referring to FIGS. 15 and 16, introducing a "non nBn" band structure that blocks minority carriers from the substrate from reaching the absorber, and visa versa, both avoid excess dark current and ensures photo-generated carriers do not recombine at the substrate interface. The diffusion barrier can act as or be combined with an etch stop to enable backside substrate removal via a chemical etch for the case of non-transparent substrates. GaSb, for example is transparent in the MWIR while InAs is absorbing.

As to area (4), and referring to FIGS. 17-21, making a small active area within each pixel will collect current from the region around it unless a biased guard ring collects this unwanted current. The light must be focused down into the region under the active area with a light concentrator. Several versions are shown, from a common guard to a guard tied with series resistors to a guard per pixel with two interconnects per pixel, with the latter providing the highest tolerance to shorting defects in the guard barrier layer at the sake of process complexity.

Figure 22:
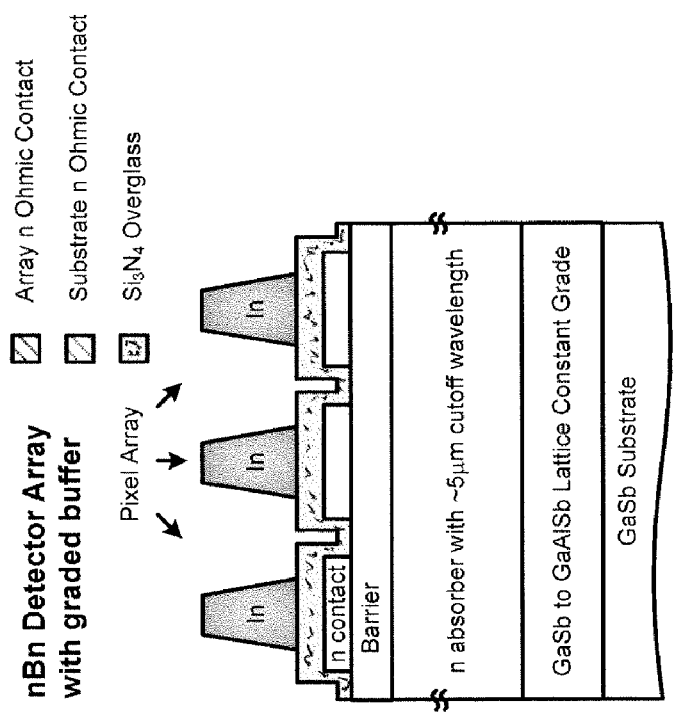
FIG. 22 shows extension of a ~5 μm cutoff in the n absorber layer.
Figure 23:
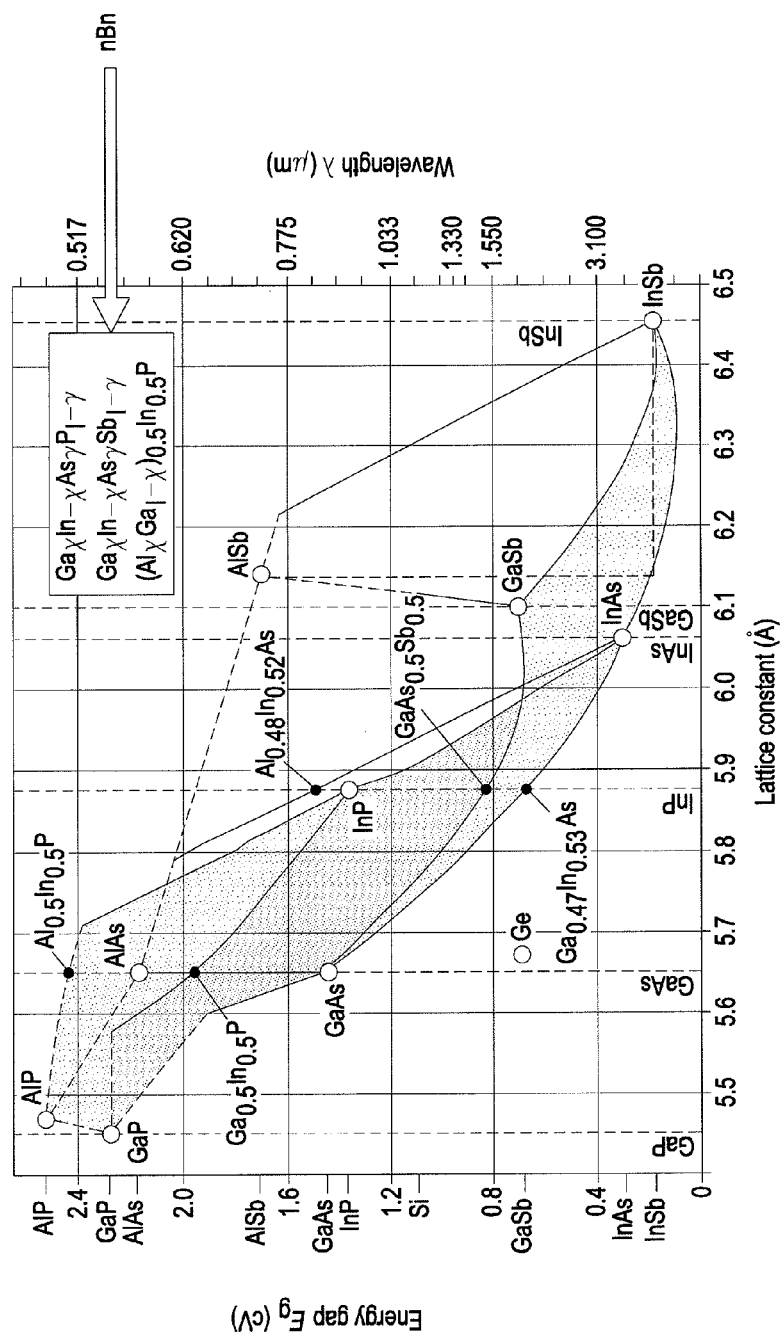
FIG. 23 shows the area of bandgap vs. lattice constant suitable for extension to ~5 μm cutoff wavelengths.

As to area (5), and referring to FIG. 23, the bandgap (and cutoff wavelength) vs. lattice constant map for the nBn materials is shown. Binary substrates such as InAs and GaSb are candidates for growing the nBn detectors with MWIR sensitivity ($3<\lambda<5$ µm). However, the lattice matched alloys to the GaSb cutoff at 4.5 µm, and it is desirable to reach a 4.8 µm or longer for threat warning applications. By growing strained AlGaSb superlattice buffer layers whose average aluminum content increases as shown in FIG. 22, the effective substrate lattice constant can be shifted to larger values. Pure AlSb, while chemically reactive with oxygen, has a lattice constant of 6.13 Angstroms which matches InAsSb alloys with a cutoff wavelength equal to InSb, ~5.3 µm. Strained superlattice layers can be used to shift lattice constants because the threading dislocations become bound at the interfaces instead of creating defects in the active material.

As to area (6), FIG. 3 shows alloys that can be used to create an nBn structure on the relatively mature InGaAs material system. The nBn structure, by eliminating excess leakage currents, enables higher operating temperature uncooled SWIR arrays for a broad range of applications including IR imaging.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A photodetector comprising
a photo absorbing layer having a predetermined doping type,
a contact layer having the predetermined doping type where said contact layer includes a plurality of contact regions, each contact region having an active area and a guard area, said guard and active areas being physically distinct; and
a barrier layer disposed between said photo absorbing and contact layers,
wherein each contact region has a physically distinct guard area; and
wherein a guard area for a first contact region is electrically connected to a second guard area of one or more adjacent contact regions by a resistor.

2. The detector of claim 1 wherein at least one semiconductor alloy is disposed at an interface of said barrier layer and at least one of said photo absorbing layer and said contact layer and where said at least one alloy is graded such that a graded band edge transition is created at said interface.

3. The photodetector of claim 1, where the predetermined doping type is n-type.

4. The photodetector of claim 1, where the barrier layer is un-doped.

5. The photodetector of claim 1, where the guard areas include ohmic metal that is supplied with a reverse bias voltage.

6. The photodetector of claim 1, where the first and second guard areas are supplied with a bias voltage.

7. The detector of claim 1 wherein said absorbing layer includes an absorber alloy having a chemical potential therein to drive minority carriers from the photo absorbing layer into the barrier layer.

8. The detector of claim 1 wherein said absorbing layer includes an absorber alloy and where the composition of the absorber alloy is graded.

9. The detector of claim 1, where the barrier layer is graded with a first grading at a first interface area between said barrier and said contact layer and graded with a second grading at a second interface area between said barrier and said photo absorbing layer such that
the first grading creates a graded transition from the minority carrier band edge of the barrier layer to the minority carrier band edge of the contact layer; and
the second grading creates a graded transition from the minority carrier band edge of the photo absorbing layer to the minority carrier band edge of the barrier layer.

10. The detector of claim 1, where the barrier layer is graded with a grading at an interface area between said barrier and said contact layer such that the grading creates a graded transition from the minority carrier band edge of the barrier layer to the minority carrier band edge of the contact layer.

11. The detector of claim 1, where the barrier layer is graded with a grading at a an interface area between said barrier and said photo absorbing layer such that the grading creates a graded transition from the minority carrier band edge of the photo absorbing layer to the minority carrier band edge of the barrier layer.

12. The detector of claim 1, where the bather layer is graded with a grading that creates a graded transition from the minority carrier band edge of the barrier layer to the minority carrier band edge of the photo absorbing layer.

13. The detector of claim 1 wherein said absorbing layer includes an absorber alloy and where the composition of the absorber alloy is graded such that a chemical potential is created in the alloy to drive minority carriers from the photo absorbing layer into the barrier layer.

14. The detector of claim 13 wherein said chemical potential reduces lateral diffusion of minority carriers within said absorber layer.

15. The detector of claim 1 additionally comprising:
a substrate disposed on said photo absorbing layer; and
a diffusion barrier portion; said diffusion barrier being disposed at an interface of said photo absorbing layer and said substrate.

16. The detector of claim 15, where the diffusion barrier includes at least a first and a second strained superlattice buffer layer, the first and second strained superlattice buffer layers having different alloy compositions.

17. The detector of claim 1 additionally comprising
a substrate layer;
and an aluminum-bearing buffer layer disposed between said photo absorbing layer and said substrate;
wherein Al content of said buffer layer is graded.

18. The detector of claim 17, where the Al content of the buffer layer is graded by including, in said buffer layer, at least a first and a second strained superlattice buffer layer, the first and second strained superlattice buffer layers having different Al content levels.

19. The detector of claim 1, where the barrier layer is graded with a first grading that creates a graded transition from the minority carrier band edge of the barrier layer to the minority carrier band edge of the contact layer.

20. The detector of claim 19, where the barrier layer is graded with a second grading that creates a graded transition from the minority carrier band edge of the photo absorbing layer to the minority carrier band edge of the barrier layer.

21. The detector of claim 1, wherein the barrier layer includes at least one concentration gradient.

22. The detector of claim 21, where the contact, absorber, and barrier layers each have a conduction band for minority carriers; and where said at least one concentration gradient of the barrier layer is configured such that the minority carrier conduction bands of the barrier and absorber layers are aligned and the minority carrier conduction bands of the barrier and contact layers are aligned.

23. The detector of claim 1 additionally comprising a light concentrator disposed above said photo absorbing layer.

24. The detector of claim 23 wherein the light concentrator comprises a microlens.

25. The detector of claim 24 wherein the microlens is incorporated into a close proximity filter.

26. A photodetector comprising:

a photo absorbing layer having a predetermined doping type, a contact layer having the predetermined doping type, and a barrier layer disposed between said photo absorbing and contact layers;

where photo absorbing layer includes an absorber alloy and where the composition of the absorber alloy is graded in a way that creates a chemical potential in the alloy to drive minority carriers from the photo absorbing layer into the barrier layer, where the barrier layer is graded with a first grading at a first interface area between said barrier and said contact layer and graded with a second grading at a second interface area between said barrier and said photo absorbing layer such that the first grading creates a gradual transition from the minority carrier band edge of the barrier layer to the minority carrier band edge of the contact layer; and the second grading creates a gradual transition from the minority carrier band edge of the photo absorbing layer to the minority carrier band edge of the barrier layer.

27. The photodetector of claim 26, where the chemical potential reduces lateral diffusion of minority carriers through the photo absorbing layer.

28. The photodetector of claim 26, where the graded absorber alloy and the second grading create the second interface.

29. The photodetector of claim 26, where the graded absorber alloy is graded by varying Al content in the absorber alloy.

30. The photodetector of claim 26, where the barrier layer is un-doped.

31. The photodetector of claim 26, where the predetermined doping type is n-type.

32. The photodetector of claim 26, where the contact layer includes a plurality of contact regions, each contact region representing a pixel.

33. The detector of claim 26 additionally comprising:

a substrate disposed on said photo absorbing layer; and a diffusion barrier portion; said diffusion barrier being disposed at an interface of said photo absorbing layer and said substrate.

34. The detector of claim 33, where the diffusion barrier includes at least a first and a second strained superlattice buffer layer, the first and second strained superlattice buffer layers having different alloy compositions.

35. The detector of claim 26 additionally comprising a substrate layer;

and an aluminum-bearing buffer layer disposed between said photo absorbing layer and said substrate;

wherein Al content of said buffer layer is graded.

36. The detector of claim 35, where the Al content of the buffer layer is graded by including, in said buffer layer, at least a first and a second strained superlattice buffer layer, the first and second strained superlattice buffer layers having different Al content levels.

* * * * *